(12) United States Patent
Watanuki et al.

(10) Patent No.: US 11,049,780 B2
(45) Date of Patent: Jun. 29, 2021

(54) ELECTRONIC MODULE AND METHOD FOR MANUFACTURING SAME

(71) Applicant: TATEYAMA KAGAKU INDUSTRY CO., LTD., Toyama (JP)

(72) Inventors: Osamu Watanuki, Toyama (JP); Kenichi Honda, Toyama (JP); Orie Shinohara, Toyama (JP); Akira Ishikawa, Kaga (JP); Tsutomu Ishikawa, Kaga (JP)

(73) Assignee: TATEYAMA KAGAKU CO., LTD., Toyama (JP)

( * ) Notice: Subject to any disclaimer, the term of this patent is extended or adjusted under 35 U.S.C. 154(b) by 0 days.

(21) Appl. No.: 16/606,738

(22) PCT Filed: Apr. 17, 2018

(86) PCT No.: PCT/JP2018/015881
§ 371 (c)(1),
(2) Date: Oct. 19, 2019

(87) PCT Pub. No.: WO2018/194062
PCT Pub. Date: Oct. 25, 2018

(65) Prior Publication Data
US 2020/0135598 A1 Apr. 30, 2020

(30) Foreign Application Priority Data
Apr. 19, 2017 (JP) .............................. JP2017-082569

(51) Int. Cl.
*H01L 23/14* (2006.01)
*H01L 23/28* (2006.01)
*H05K 1/18* (2006.01)
*H05K 3/28* (2006.01)

(52) U.S. Cl.
CPC .............. *H01L 23/14* (2013.01); *H01L 23/28* (2013.01); *H05K 1/181* (2013.01); *H05K 1/186* (2013.01);
(Continued)

(58) Field of Classification Search
CPC ......... H01L 23/14; H01L 23/28; H05K 1/181; H05K 1/186; H05K 1/189; H05K 3/284; H05K 2203/1316
(Continued)

(56) References Cited

U.S. PATENT DOCUMENTS 7,084,352 B2 8/2006 Kobayashi
2002/0001880 A1 1/2002 Kobayashi
(Continued)

FOREIGN PATENT DOCUMENTS

EP 1677583 A1 7/2006
EP 2700867 A1 2/2014
(Continued)

OTHER PUBLICATIONS

International Preliminary Report on Patentability (IPRP) dated Oct. 31, 2019 (and English translation thereof), issued in International Application No. PCT/JP2018/015881.
(Continued)

*Primary Examiner* — Tong-Ho Kim
(74) *Attorney, Agent, or Firm* — Holtz, Holtz & Volek PC

(57) ABSTRACT

An electronic module includes a substrate having flexibility and an electrical insulation property, a circuit unit in which an electronic device is mounted on a wiring pattern formed on at least any one of surfaces of the substrate, and a resin body in which the circuit unit is sealed with an electrical insulating resin, wherein the substrate has flexibility to be deformable due to a pressure during sealing with the electrical insulating resin.

26 Claims, 13 Drawing Sheets

(52) U.S. Cl.
CPC ............. *H05K 1/189* (2013.01); *H05K 3/284* (2013.01); *H05K 2203/1316* (2013.01)

(58) Field of Classification Search
USPC .......................................................... 257/773
See application file for complete search history.

(56) References Cited

U.S. PATENT DOCUMENTS

| | | |
|---|---|---|
| 2002/0197773 A1 | 12/2002 | Kobayashi |
| 2004/0212077 A1 | 10/2004 | Kobayashi |
| 2006/0171127 A1 | 8/2006 | Kadoya et al. |
| 2011/0007509 A1 | 1/2011 | Hayes et al. |
| 2012/0230031 A1 | 9/2012 | Hayes et al. |
| 2013/0176746 A1* | 7/2013 | Nishimura ............. H05K 3/284 362/382 |
| 2016/0252231 A1 | 9/2016 | Fujikawa et al. |

FOREIGN PATENT DOCUMENTS

| | | | | |
|---|---|---|---|---|
| JP | H09121090 A | | 5/1997 | |
| JP | 2016092261 A | * | 5/2016 | ......... H01L 23/3121 |
| JP | 2016092261 A | | 5/2016 | |
| WO | 2012049898 A1 | | 4/2012 | |
| WO | 2014132973 A1 | | 9/2014 | |

OTHER PUBLICATIONS

International Search Report (ISR) dated Jun. 26, 2018 (and English translation thereof) issued in International Application No. PCT/JP2018/015881.

Written Opinion of the International Searching Authority dated Jun. 26, 2018 issued in International Application No. PCT/JP2018/015881.

Extended European Search Report (EESR) dated Jul. 7, 2020 issued in European Application No. 18788521.5.

* cited by examiner (a)

(b)

(c)

(a)

(b)

(c)

(a)

(b)

(c)

ELECTRONIC MODULE AND METHOD FOR MANUFACTURING SAME

TECHNICAL FIELD

The present invention relates to an electronic module in which a circuit unit having an electronic device such as light emitting element or IC chip mounted thereon is sealed with an electrical insulating resin and a method for manufacturing the same.

BACKGROUND ART

As disclosed in Patent Literature 1, for example, in this type of electronic module, an electronic device is mounted on a substrate having a wiring pattern formed thereon, and the substrate having the electronic device mounted thereon is held in position and accommodated in a chassis. The inside of the chassis is filled with a resin while the electronic device is held in position in the chassis, whereby the substrate having the electronic device mounted thereon is sealed with the resin.

CITATION LIST

Patent Literature

Patent Literature 1: Japanese Laid-open Patent Publication No. 9-121090

SUMMARY OF THE INVENTION

Problems to be Solved by the Invention

However, with the configuration in Patent Literature 1, when the substrate having the electronic device mounted thereon is sealed with a resin, the melted resin with which the chassis is filled applies a large pressure to the substrate and the electronic device. This causes problems of damages delivered to the electronic device mounted on the substrate and the occurrence of disconnection in the wiring pattern on the substrate.

The present invention has been made in consideration of the problems, and it has an object to provide an electronic module and a method for manufacturing the same with which it is possible to avoid damages delivered to an electronic device and the occurrence of disconnection in a wiring pattern.

Means for Solving the Problem

According to the present invention, an electronic module includes: a substrate having flexibility and an electrical insulation property; a circuit unit in which an electronic device is mounted on a wiring pattern formed on at least any one of surfaces of the substrate; and a resin body in which the circuit unit is sealed with an electrical insulating resin, wherein the substrate has flexibility to be deformable due to a pressure during sealing with the electrical insulating resin.

The wiring pattern is composed of a metallic foil that enables soldering, and the metallic foil is composed of a material having a recrystallization temperature equal to or less than a molding temperature at which the circuit unit is sealed with the electrical insulating resin. Furthermore, the metallic foil may be composed of a material having a melting temperature equal to or less than a molding temperature at which the circuit unit is sealed with the electrical insulating resin.

The metallic foil is preferably composed of a solder foil. Furthermore, it is preferable that a foundation layer having a conductive property is provided on the one of the surfaces of the substrate and the metallic foil is formed on the foundation layer. It is preferable that the foundation layer has solderability for melted solder.

The substrate is composed of a material having air permeability. Particularly, it is preferable that the substrate is composed of a glass cloth made of a large number of glass fibers and, on a surface of the glass cloth at an opposite side of a surface where the electronic device is mounted, a retention layer made of a resin having flexibility that is nearly equal to or more than the glass cloth is provided. The retention layer is composed of, for example, urethane resin.

Furthermore, according to the present invention, a method for manufacturing an electronic module includes: a circuit-unit forming step of forming a circuit unit by forming a wiring pattern on a surface of a substrate having flexibility and an electrical insulation property and mounting an electronic device on the wiring pattern; and a sealing step of sealing the circuit unit with a resin body of an electrical insulating resin, wherein the substrate is composed of a flexible material that is deformable during sealing with the electrical insulating resin, and the sealing step seals the substrate and the circuit unit with the electrical insulating resin.

The wiring pattern is composed of a metallic foil that enables soldering, the metallic foil has a recrystallization temperature equal to or less than a molding temperature of the electrical insulating resin, and the circuit-unit forming step solders the electronic device to the wiring pattern. Furthermore, the metallic foil may have a melting temperature equal to or less than a molding temperature of the electrical insulating resin, and the circuit-unit forming step may solder the electronic device to the wiring pattern.

The sealing step mounts the substrate and the circuit unit in a cavity of a mold, injects the melted electrical insulating resin having thermal plasticity into the cavity to be molded and hardened, and seals the substrate and the circuit unit with the electrical insulating resin.

The sealing step may sandwich the substrate and the circuit unit with sheets of the electrical insulating resin having thermal plasticity, cause the sheets to be pressed against each other, and seal the substrate and the circuit unit.

The sealing step may mount the substrate and the circuit unit in a cavity of a mold, inject a thermo-setting resin having flowability into the cavity to be hardened, and seal the substrate and the circuit unit with the electrical insulating resin.

The sealing step may mount the substrate and the circuit unit in a mold-type housing portion, inject a thermo-setting resin having flowability into the housing portion, immerse the substrate and the circuit unit in the thermo-setting resin, harden the electrical insulating resin, and seal the substrate and the circuit unit with the electrical insulating resin.

The sealing step may mount the substrate and the circuit unit in a mold-type housing portion, sandwich the substrate and the circuit unit with soft thermo-setting resin, form the electrical insulating resin with the mold, and seal the substrate and the circuit unit.

Effect of the Invention

With the electronic module and the method for manufacturing the same according to the present invention, in the structure for sealing a circuit unit and a substrate with resin, the circuit unit being formed by connecting an electronic device to a wiring pattern formed on a surface of the substrate having flexibility and an electrical insulation property, it is possible to reduce loads on the electronic device and the wiring pattern during resin sealing and prevent damages to the electronic device and disconnection in the wiring pattern.

MODE FOR CARRYING OUT THE INVENTION

Figure 1:
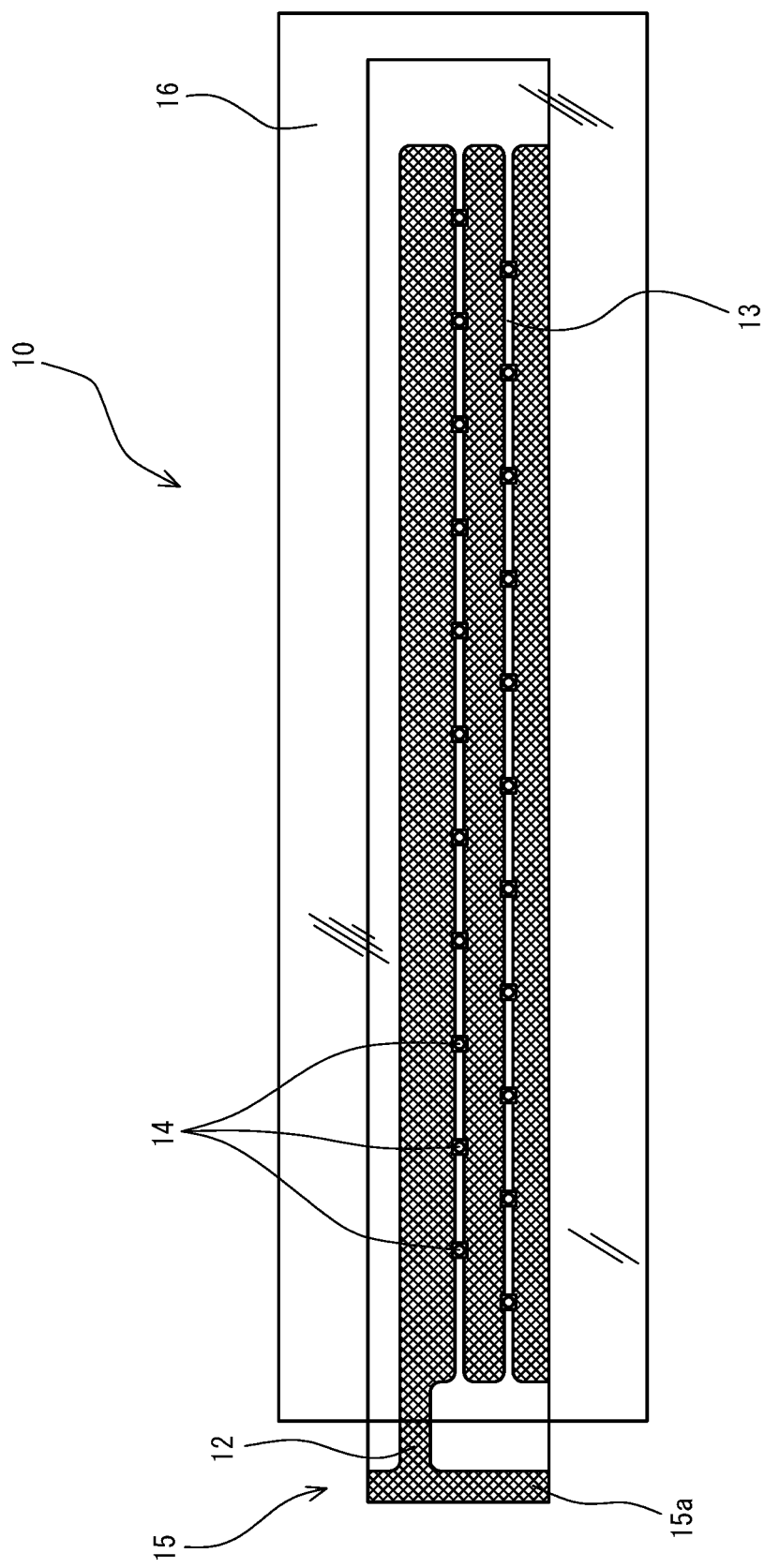
FIG. 1 is a plan view of an electronic module according to a first embodiment of the present invention.

FIG. 1 illustrates an electronic module 10 according to a first embodiment of the present invention. The electronic module 10 includes a substrate 12 having flexibility, limberness, and an electrical insulation property and shaped like a sheet or plate having a front surface and a back surface. The substrate 12 includes: a circuit unit 15 having a wiring pattern 13 formed on one of the front surface and the back surface and having electronic devices 14, such as light emitting elements, mounted on the wiring pattern 13; and a resin body 16 that seals the circuit unit 15 with an electrical insulating resin. The circuit unit 15 is configured to be electrically connectable to an undepicted device, or the like, as a terminal portion 15a, which is one end portion, is not sealed with the resin body 16. According to the embodiment, the electronic module 10 of an optical system is configured by mounting the light emitting elements, which are the electronic devices 14, on the substrate 12. Light emitting diodes, laser diodes, or the like, may be used as the light emitting elements. The electronic device 14 may include a light receiving element, chip-like electronic component, IC, or other electronic components.

In the electronic module 10, the electronic device 14 is mounted on the wiring pattern 13 formed on one of the surfaces of the substrate 12 having flexibility; therefore, the substrate 12 is deformed due to the pressure from the melted resin so that the force received by the substrate 12 and the circuit unit 15 from the melted resin may be reduced. The flexibility mentioned here means flexibility enough to enable deformation due to the pressure applied from the electrical insulating resin during sealing with the electrical insulating resin. This allows the electronic module 10 to prevent damages to the electronic device 14 mounted on the substrate 12 during resin sealing and also prevents the occurrence of disconnection in the wiring pattern 13.

The substrate 12 is composed of a material having air permeability. Specifically, the substrate 12 is preferably composed of a glass cloth made of a large number of glass fibers. Any other materials having flexibility and an electrical insulation property may be used, such as sheets composed of paper, non-woven cloth, or synthetic resin cloth having a large number of synthetic fibers woven therein. As the substrate 12 is composed of a material having air permeability, the melted resin also easily moves to the surface of the substrate 12 (the lower surface of the substrate 12 in FIG. 2) at the opposite side of the surface where the electronic device 14 is mounted. Furthermore, as the melted electrical insulating resin enters clearances (meshes of the glass cloth) formed in the substrate 12 having air permeability, the pressure applied to the electronic device 14 mounted on the substrate 12 from the melted resin may be effectively reduced. This may reduce production of defective pieces and improve productivity.

On one of the surfaces of the substrate 12, a foundation layer 17 having solderability for melted solder is formed in the same pattern shape as the wiring pattern 13. The foundation layer 17 is composed of a resin having a conductive property. As the foundation layer 17 is thus composed of a resin having a conductive property, application of electric currents between the electronic device 14 mounted on the substrate 12 and the wiring pattern 13 is maintainable through the foundation layer 17 having a conductive property even when cracks occur in the wiring pattern 13. The foundation layer 17 may be composed of not only a resin having a conductive property but also a metal layer different from solder, such as nickel (Ni) plated layer, gold (Au) plated layer, or copper (Cu) plated layer.

When the glass cloth of the substrate 12 is formed by weaving a large number of glass fibers, the glass fibers are easily loosened; to avoid loosening, it is preferable to provide a retention layer 18 of urethane resin having flexibility on the surface (the lower surface in FIG. 2) of the substrate 2 at the opposite side of the surface where the electronic device 14 is mounted. The retention layer 18 is formed by applying melted urethane resin to the lower surface of the substrate 12. As the retention layer 18 of the urethane resin having flexibility is integrated by being dug into the meshes of the glass cloth, the flexibility of the glass cloth is not disturbed. Here, although a urethane resin having high flexibility is used as the retention layer 18, various types of resin layers having flexibility may be used as the retention layer 18.

According to the embodiment, the resin body 16 made of an electrical insulating resin having flexibility is composed of a transparent resin as it seals the electronic device 14 that is an optical device. As the material of the resin body 16 of the electrical insulating resin, for example, polyethylene terephthalate (PET), polyimide (PI), polyethylene naphthalate (PEN), polyethersulfone (PES), polyether ether ketone (PEEK), polycarbonate (PC), polypropylene (PP), polyamide (PA), polystyrene (PS), acrylic, cycloolefin polymer, polyacetal, amorphous polyolefin-based resin, cyclic polyolefin-based resin, aliphatic cyclic polyolefin, or norbornene-based thermoplastic transparent resin is suitable for use.

Furthermore, as the resin body 16 made of the electrical insulating resin, silicone resin, silicone rubber, or other transparent resins having heat hardening properties may be used.

Furthermore, according to the embodiment, as the electronic device 14, which is an optical device, is mounted on the substrate 12, the resin body 16 is configured to conduct sealing with a transparent resin. Therefore, the resin body 16 made of the electrical insulating resin does not need to be a transparent resin as long as it is a resin material allowing passage of light. Moreover, it is possible to apply a coating material enough to allow passage of light to a surface of a transparent resin.

The wiring pattern 13 is composed of a metallic foil that enables soldering; the metallic foil is a solder foil according to the embodiment, and it facilitates and ensures the connection of the electronic device 14 to the wiring pattern 13 with solder. The solder foil of the wiring pattern 13 is composed of a material having a melting temperature equal to or less than the molding temperature of the electrical insulating resin during sealing of the circuit unit 15 after the melted electrical insulating resin is injected into cavities 19S, 19S1 in a mold 19 described later.

According to the embodiment, as the metallic foil (here, solder foil) forming the wiring pattern 13 is composed of a material having a melting temperature equal to or less than the molding temperature of the resin body 16, at least part of the metallic material forming the metallic foil is softened or melted due to the molding temperature at which the circuit unit 15 is sealed by injecting the melted electrical insulating resin into the cavities 19S, 19S1. Thus, even when the melted resin sharply flows into the cavities 19S, 19S1 during sealing of the circuit unit 15, the metallic foil of the wiring pattern 13 is tolerant of deformation of the substrate 12 and disconnection does not occur. Furthermore, it is possible to reduce stress received by the substrate 12 due to thermal expansion and contraction of the resin body 16 of the electrical insulating resin and the wiring pattern 13 of the metallic foil during molding to seal the circuit unit 15. Moreover, the oxide film already formed on the surface of the metallic foil reduces deformation of the metallic foil due to melting of the metallic material.

When the temperature inside the cavities 19S, 19S1 is equal to or higher than the recrystallization temperature of the metallic material although the temperature inside the cavities 19S, 19S1 is lower than the melting temperature of the metallic material forming the metallic foil, the metallic material is heated and softened, the metallic foil, such as solder foil, is easily deformed, and damages are less likely to occur. Thus, in the same manner as that described above, it is possible to reduce stress received by the substrate 12 due to thermal expansion and contraction of the resin body 16 of the electrical insulating resin and the wiring pattern 13 of the metallic foil during molding to seal the circuit unit 15.

Next, the method for manufacturing the electronic module 10 having the above-described configuration is explained. The method for manufacturing the electronic module 10 includes, as primary steps, a circuit-unit forming step of forming the circuit unit 15 by forming the wiring pattern 13 on the surface of the substrate having an electrical insulation property and mounting the electronic device 14 on the wiring pattern 13; and a sealing step of sealing the circuit unit 15 with the resin body 16 of the electrical insulating resin.

The circuit-unit forming step includes a retention-layer forming step, a screen-printing step, a wiring-pattern forming step, and a mounting step of the electronic device 14.

At the retention-layer forming step, the melted urethane resin is applied to the back surface (the lower surface in FIG. 2) of the substrate 12. The retention layer 18 formed on the substrate 12 makes it possible to attract and fix the substrate 12 during printing and improves separation of the screen plate. Furthermore, it is possible to prevent foundation inks from permeating into the back surface of the substrate 12. The retention-layer forming step may be performed after or before the screen-printing step or the mounting step, and the retention layer 18 of urethane resin may be previously formed on the substrate 12. Moreover, the retention-layer forming step may be omitted as long as there is no problem in fixing of the substrate 12 described above or loosening of fibers of the substrate 12.

Figure 2:
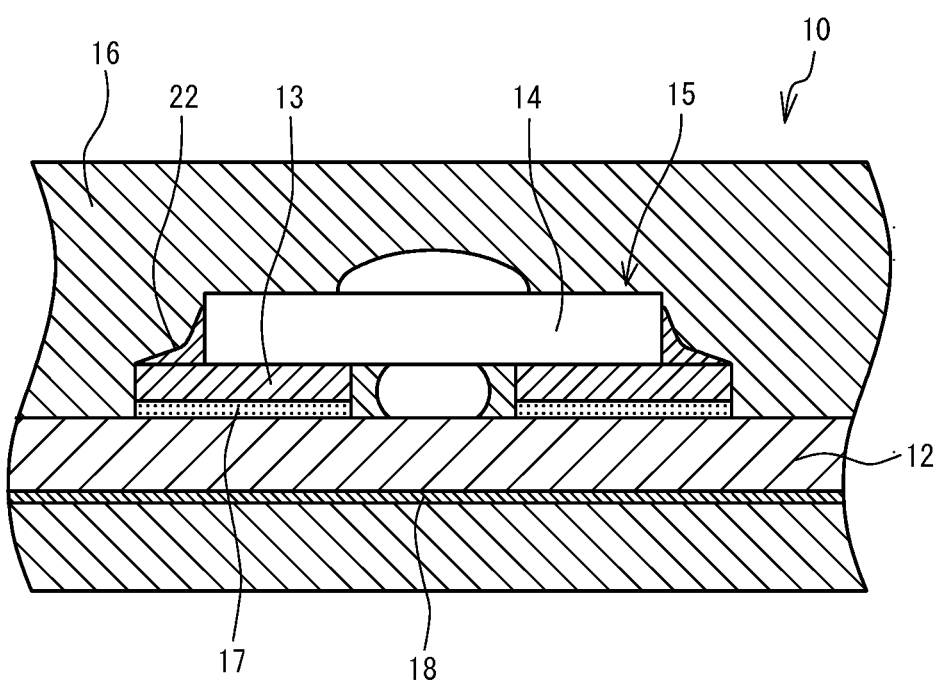
FIG. 2 is a longitudinal sectional view of the relevant part of the electronic module in FIG. 1.
Figure 3:
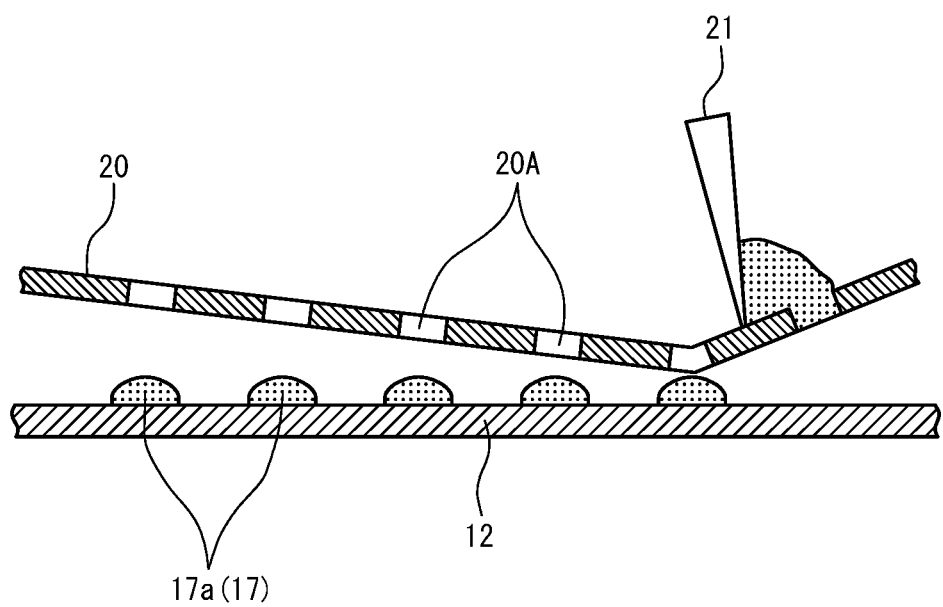
FIG. 3 is a diagram that illustrates a state where foundation inks are applied at a screen-printing step during manufacturing of the electronic module according to the embodiment.
Figure 4:
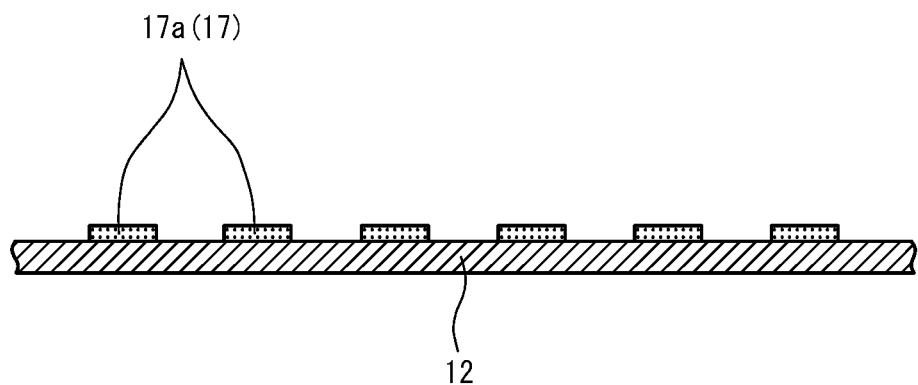
FIG. 4 is a diagram that illustrates a state where foundation inks are hardened after the screen printing during manufacturing of the electronic module according to the embodiment.
Figure 5:
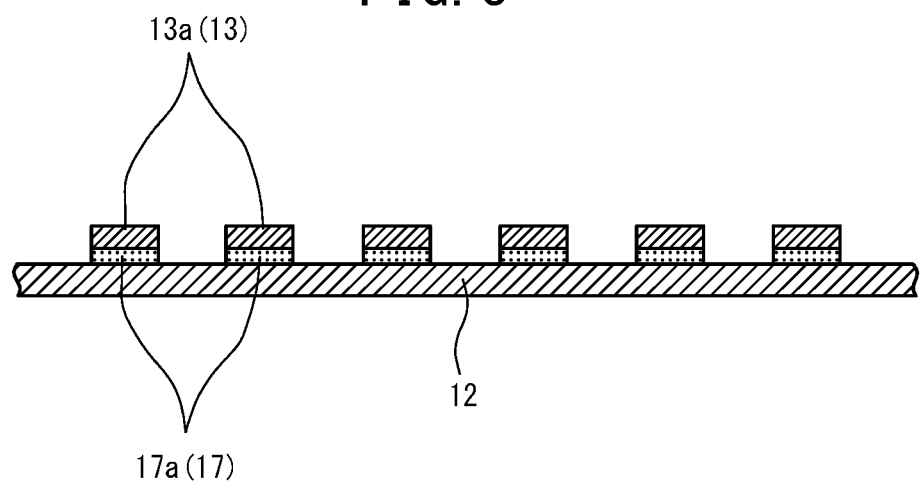
FIG. 5 is a diagram that illustrates a state where a wiring solder layer is placed on a foundation ink during manufacturing of the electronic module according to the embodiment.

As illustrated in FIG. 3, the screen-printing step is a step of applying a foundation ink 17a to form the foundation layer 17 on one of the surfaces (the upper surface in FIG. 3) of the substrate 12 at the mounting side by using a screen 20 having a large number of openings 20A formed at predetermined positions and a squeegee 21. The wiring-pattern forming step is a step of applying wiring solder 13a for forming the wiring pattern 13 onto the foundation ink 17a after the screen-printing step is finished, and as illustrated in FIG. 4, after the foundation ink 17a gets hardened. As illustrated in FIG. 5, the wiring solder 13a is applied to the top of the hardened foundation layer 17 in an overlapped manner. After the wiring-pattern forming step is finished, the mounting step is performed. Although the mounting step is not illustrated, the electronic device 14, such as a light emitting element, is placed on the wiring pattern 13, an electrode of the electronic device 14 is connected to the wiring pattern 13 with solder 22, as illustrated in FIG. 2, and the mounting step for the electronic device 14 is completed. The above-described steps complete the circuit-unit forming step.

After the circuit unit 15 is mounted at the circuit-unit forming step, a transition is made to the sealing step. At the sealing step, each surface of the substrate 12 including the circuit unit 15 is individually sealed so that both surfaces of the circuit unit 15 are sealed. First, the mold 19 used at the sealing step is explained.

Figure 6:
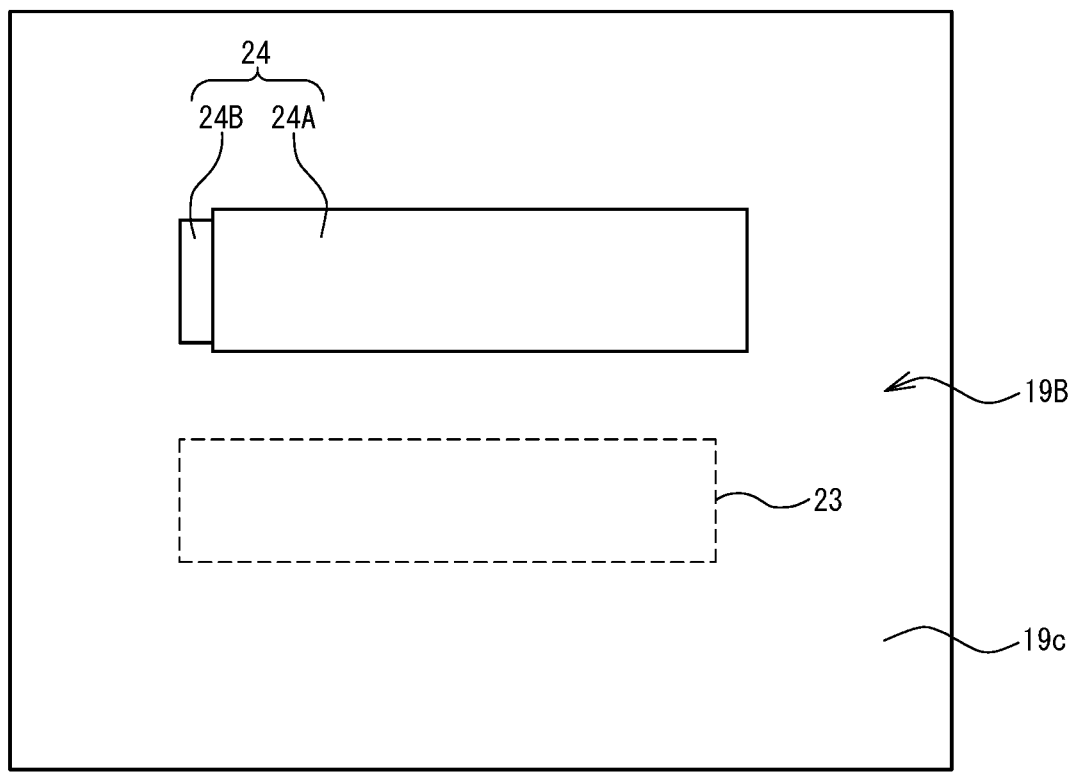
FIG. 6 is a plan view of a movable-side mold, one in a pair of upper and lower molds, for injection molding of the electronic module according to the embodiment.

As illustrated in FIG. 6 to FIG. 11, the mold 19 includes: a fixed-side mold portion 19A located on the upper side; and a movable-side mold portion 19B located on the lower side and movable in a vertical direction. As illustrated in FIG. 6, on the surface of the movable-side mold portion 19B, a rectangular mark 23 for defining the attaching position of the circuit unit 15 having the electronic device 14 mounted therein is formed in a dashed line. The mark 23 is defined in the same size as the outer shape of the circuit unit 15, and the outer shape of the circuit unit 15 is aligned with the dashed line of the mark 23 for attachment. The mark 23 may be any mark, such as a solid line or a color code, which is distinguishable from the surroundings.

Figure 10:
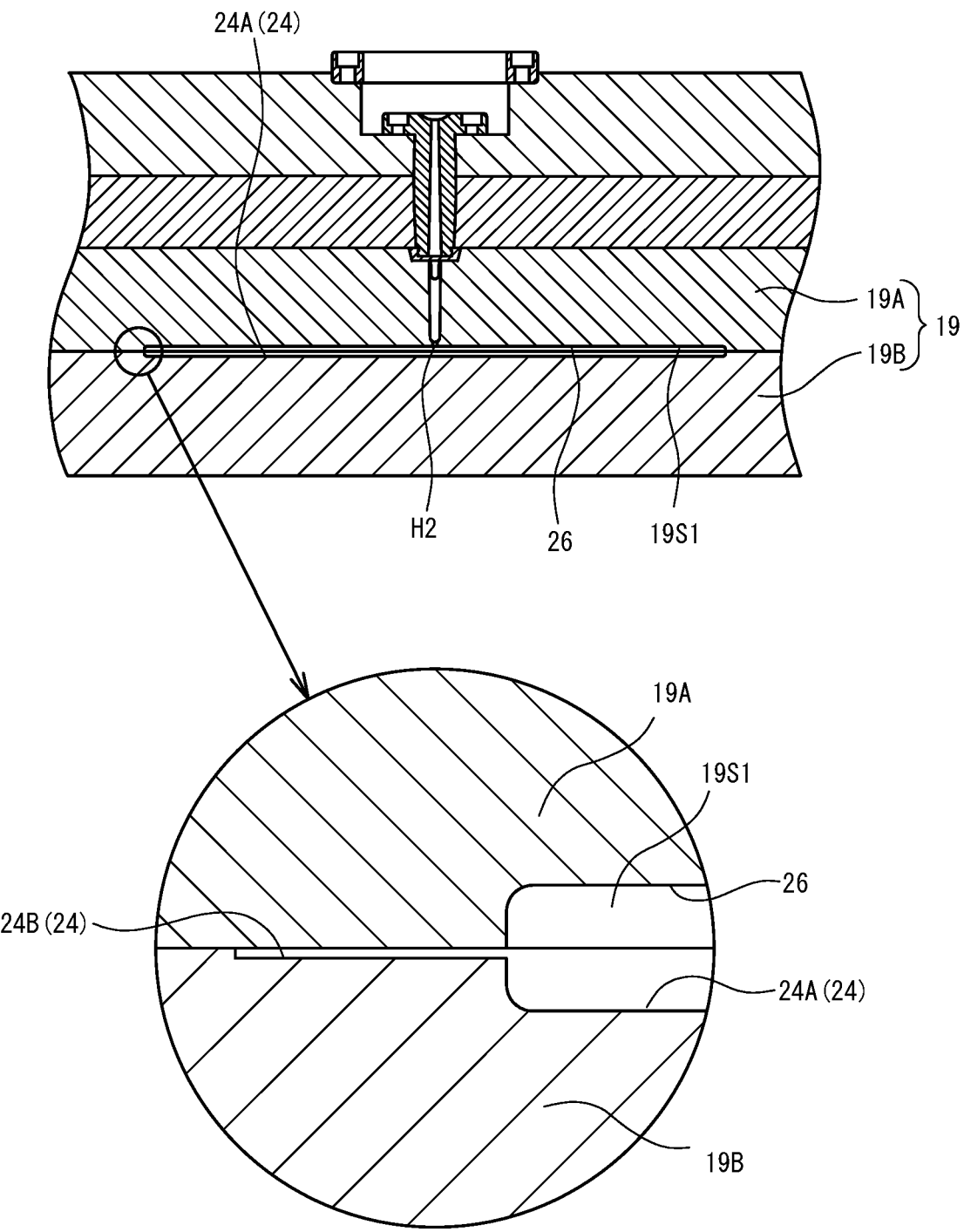
FIG. 10 is a longitudinal sectional view of a part for molding a secondarily molded object in a state where the upper and lower molds in pair are closed during the step for manufacturing the electronic module according to the embodiment.
Figure 11:
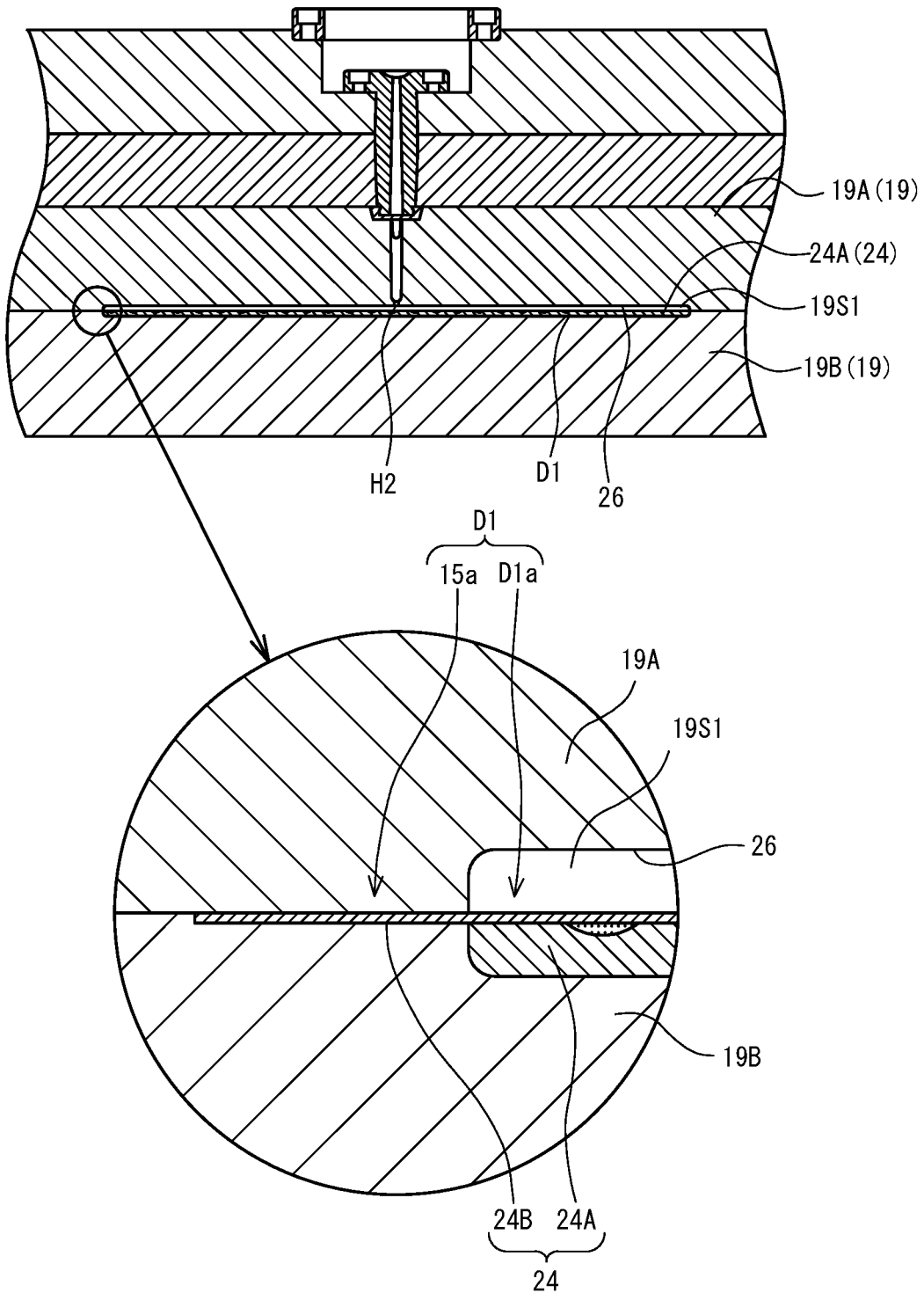
FIG. 11 is a longitudinal sectional view that illustrates, in the longitudinal sectional view of the pair of upper and lower molds in FIG. 10, a state where the primarily molded object, in which one surface of the circuit unit having the electronic device mounted on the substrate is sealed with a resin, is installed in the mold.

Next to the mark 23 on the mold portion 19B, a secondary-side first recessed portion 24 is formed for secondary molding of a primarily molded object D1 during the primary molding. The first recessed portion 24 is a space located parallel to and adjacent to the mark 23 to accommodate the primarily molded object D1 in which the surface, at the mounting side, of the circuit unit 15 having the electronic device 14 mounted therein is sealed with a resin during the primary molding. As illustrated in FIG. 10 and FIG. 11, the first recessed portion 24 includes: a main-body side recessed portion 24A that accommodates a main-body portion D1$a$ that is the resin-sealed portion of the primarily molded object D1 of the circuit unit 15; and a terminal-portion side recessed portion 24B that accommodates the terminal portion 15$a$ that is one end, which is not sealed with resin, of the primarily molded object D1 of the circuit unit 15. The terminal-portion side end 24B has a width slightly smaller than the main-body side recessed portion 24A and has a depth small enough to receive the substrate 12.

Figure 7:
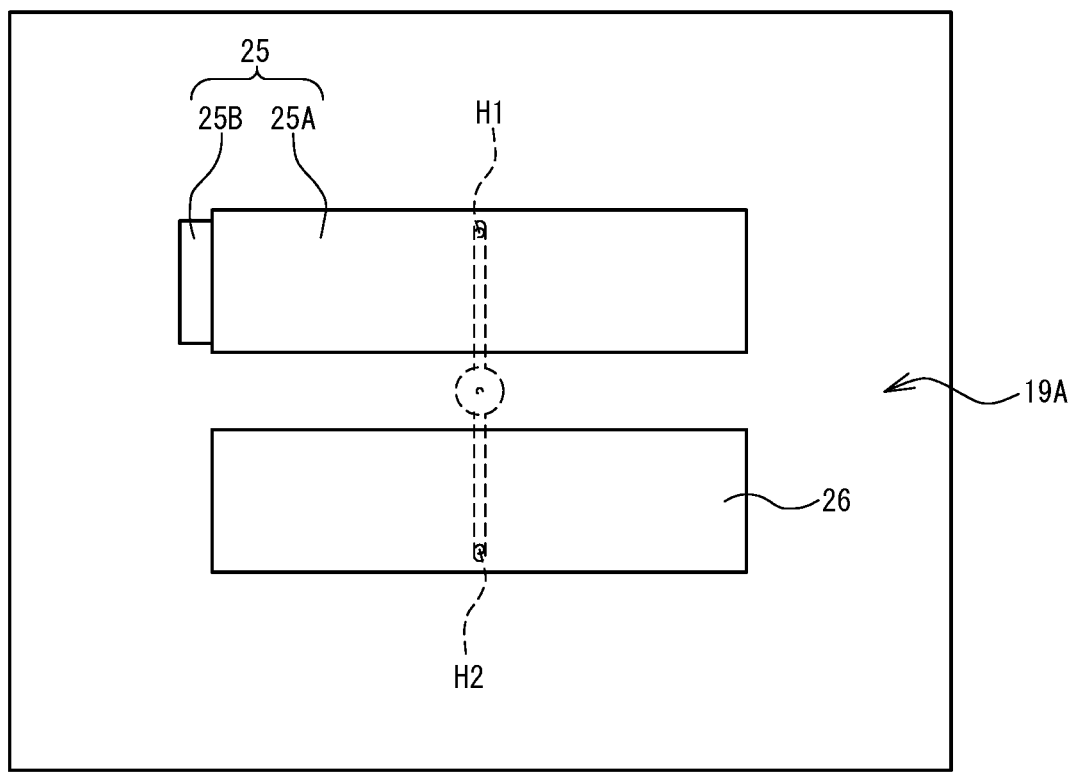
FIG. 7 is a bottom view of a fixed-side mold, the other one in the pair of upper and lower molds, for injection molding of the electronic module according to the embodiment.
Figure 8:
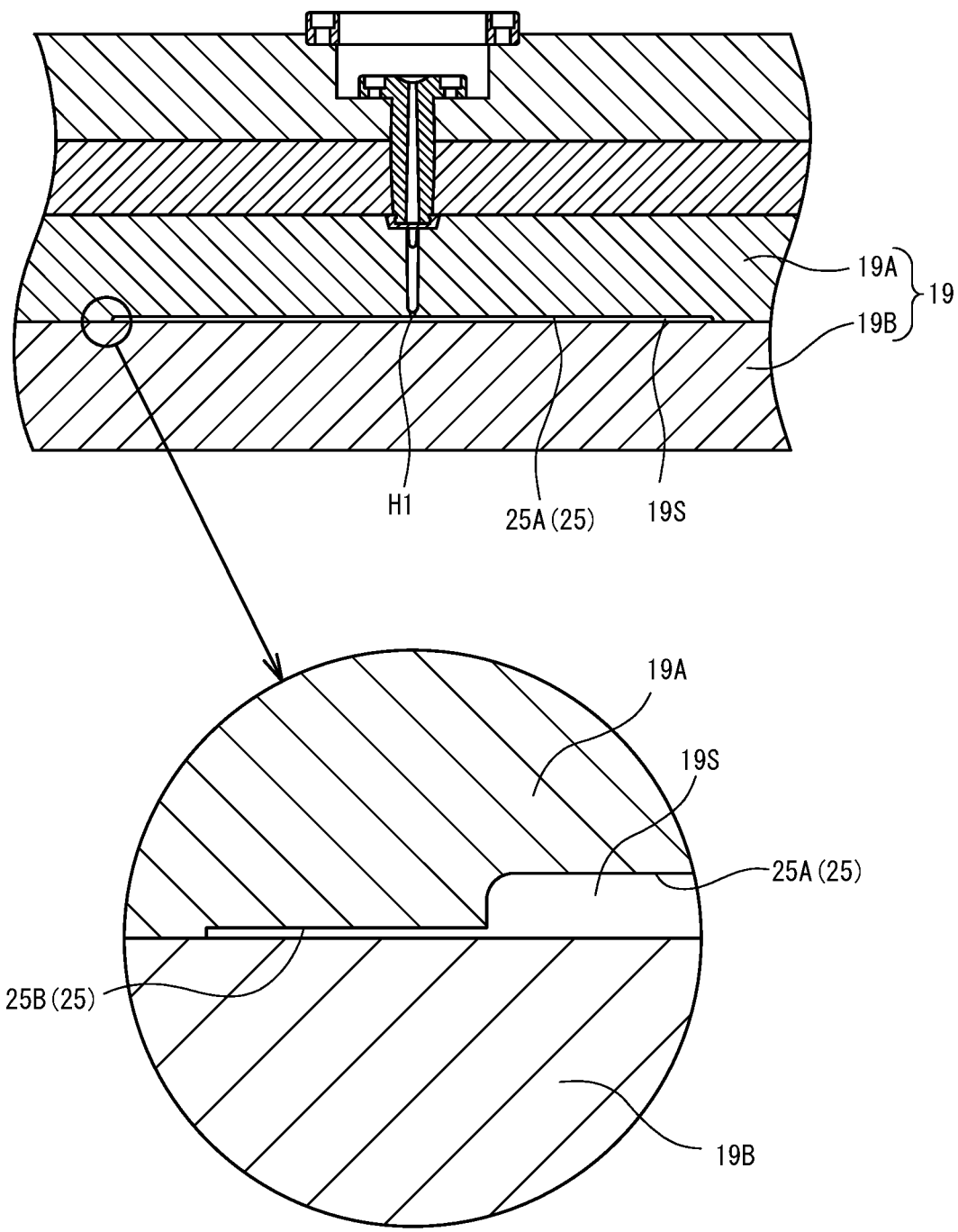
FIG. 8 is a longitudinal sectional view of a part for molding a primarily molded object by closing the pair of upper and lower molds during manufacturing of the electronic module according to the embodiment.
Figure 9:
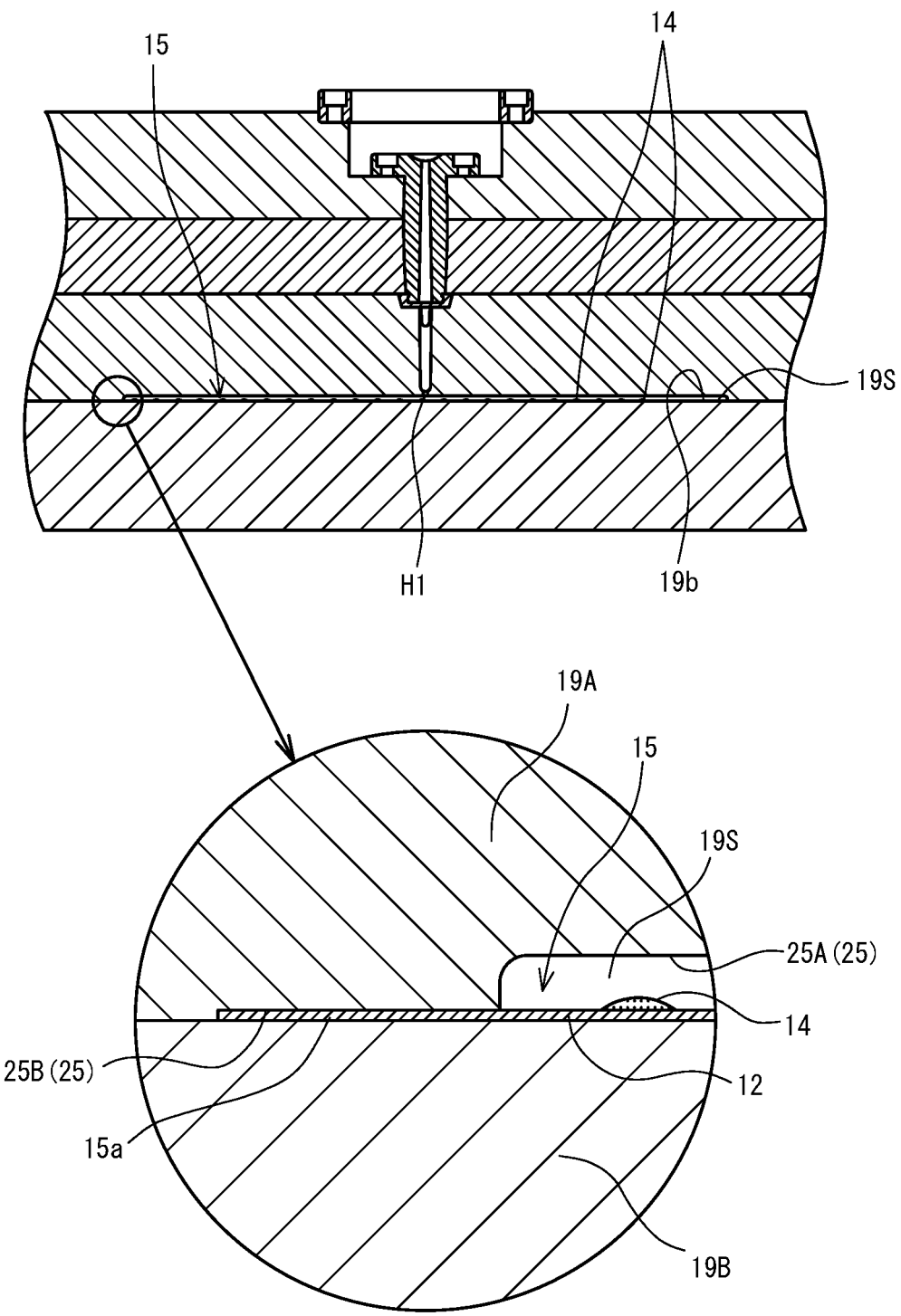
FIG. 9 is a cross-sectional view that, in the longitudinal sectional view of the pair of upper and lower molds in FIG. 8, illustrates a state where a circuit unit having an electronic device mounted on a substrate is installed in the mold.

As illustrated in FIG. 7 to FIG. 9, the fixed-side mold portion 19A includes a second recessed portion 25 that is provided with a cavity 19S for, during the primary molding, housing the upper side of the circuit unit 15 having the electronic device 14 mounted therein and sealing the surface of the circuit unit 15 at the mounting side with a resin. The second recessed portion 25 of the mold portion 19A includes: a resin-filling recessed portion 25A provided with the cavity 19S that is filled with a resin; and a terminal-portion side recessed portion 25B that accommodates the terminal portion 15$a$ that is one end portion, which is not sealed with the resin, of the circuit unit 15 having the electronic device 14 mounted therein. The terminal-portion side recessed portion 25B has a width slightly smaller than the resin-filling recessed portion 25A and has a depth small enough to receive the substrate 12.

Adjacent to the second recessed portion 25 on the mold portion 19A, a secondary-side third recessed portion 26 is formed for the secondary molding by covering the surface of the primarily molded object D1 at the opposite side of the resin-sealed side of the circuit unit 15. By filling the secondary-side third recessed portion 26 with the melted resin, the surface of the primarily molded object D1 at the opposite side of the mounting side is sealed with the resin. As illustrated in FIG. 10 and FIG. 11, the secondary-side third recessed portion 26 is formed adjacent to the primary-side second recessed portion 25 and is provided with the cavity 19S1 that is filled with a resin. The third recessed portion 26 is configured to have the same size as the main-body portion D1$a$ of the primarily molded object D1.

Next, based on FIG. 6 to FIG. 11, an explanation is given of, at the sealing step, a step of sealing the surface, at the mounting side, of the circuit unit 15 having the electronic device 14 mounted therein with a resin. At the sealing step, the movable-side mold portion 19B is lowered so that the upper and lower mold portions 19A, 19B in pair are opened. In this state, the circuit unit 15 is disposed such that outer shape of the substrate 12 is aligned with the mark 23 of the movable-side mold portion 19B on the lower side. The circuit unit 15 is arranged such that the surface where the electronic device 14 is mounted faces upward. Here, the circuit unit 15 is fixed to a flat surface (upper surface) 19$c$ of the movable-side mold portion 19B on the lower side with a double-sided tape so that the circuit unit 15 is prevented from being largely moved within the mold during injection of melted resin.

As illustrated in FIG. 9, after the circuit unit 15 is placed, the movable-side mold portion 19B on the lower side is lifted so that the mold portions 19A, 19B in pair are closed. In this state, through an injection port H1 that is formed at substantially the center, in its longitudinal direction, of the fixed-side mold portion 19A on the upper side and near one end thereof in its lateral direction, the melted thermoplastic resin is injected into the resin-filling recessed portion 25A of the second recessed portion 25 of the fixed-side mold portion 19A on the upper side. While the electronic device 14 is covered with the injected melted resin, the melted resin reaches the mounting-side surface of the substrate 12 and the surface thereof at the opposite side of the mounting side through the meshes of the substrate 12, whereby the mounting-side surface of the substrate 12 is fully covered.

After injection molding, the mold portions 19A, 19B are cooled, the movable-side mold portion 19B on the lower side is lowered so that the mold portions 19A, 19B are opened, and the circuit unit 15 with one side of the substrate 12 resin-sealed is taken out. Here, the mold 19 includes the mold portions 19A, 19B that are opened and closed in a vertical direction; however, mold portions that are opened and closed in a horizontal direction may be provided.

Then, on the primarily molded object D1, in which the mounting-side surface of the circuit unit 15 having the electronic device 14 attached thereto is sealed with the resin, the secondary molding is conducted to resin-seal the surface at the opposite side of the mounting side. First, the primarily molded object D1 is placed in the first recessed portion 24 of the movable-side mold portion 19B on the lower side such that the surface of the primarily molded object D1, which has been molded, at the opposite side of the mounting side faces upward. As illustrated in FIG. 10 and FIG. 11, after the primarily molded object D1 is placed, the movable-side mold portion 19B on the lower side is lifted so that the mold portions 19A, 19B in pair are closed. In this state, through an injection port H2 that is formed at substantially the center, in its longitudinal direction, of the mold portion 19A on the upper side and nearby in its lateral direction (at the opposite side of the injection port H1), the melted thermoplastic resin is injected into the secondary-side third recessed portion 26 of the mold portion 19A on the upper side. Due to the injected melted resin, the surface of the substrate 12 at the opposite side of the mounting-side surface is covered with the melted resin.

Thus, both surfaces of the circuit unit 15 on the substrate 12 are fully covered with the resin, and the part covered with the resin has waterproof property. Furthermore, as illustrated in FIG. 2, the inner surface of the wiring pattern 13 and the inner surface of the foundation layer 17 are also covered with resin that enters through the meshes of the substrate 12. After injection molding, the mold portions 19A, 19B are cooled, the movable-side mold portion 19B on the lower side is lowered so that the mold portions 19A, 19B in pair are opened, the electronic module 10, a secondarily molded object, with both surfaces thereof sealed with resin is taken out, and the sealing step for the circuit unit 15 is finished.

Here, the temperature of the resin with which the cavities 19S, 19S1 of the mold portions 19A, 19B are filled is, for example, approximately 250° C., and the melting temperature or the recrystallization temperature of solder of the solder foil forming the wiring pattern 13 and the melting temperature or the recrystallization temperature of solder for mounting the electronic device 14 are approximately 220° C. that is a temperature lower than the temperature of the resin with which the cavities 19S, 19S1 are filled. Here, the solder forming the wiring pattern 13 and the solder for mounting the electronic device 14 have the same melting temperature, that is, they are formed of the same component; however, they may be solders with different melting temperatures.

As at least part of the solder becomes softened or melted due to injected melted resin, it is possible to reduce stress received by the substrate 12 due to thermal expansion and contraction of the solder foil during molding to seal the circuit unit 15 as described above. Furthermore, as the softening temperature of the typical glass cloth is equal to or more than approximately 750° C., there is no deformation or melting due to melted resin during injection.

Furthermore, instead of the glass cloth, it is possible to use paper, non-woven cloth, or synthetic resin cloth having a large number of synthetic fibers woven therein. In this case, it is preferable to form it with a material that is not melted due to injected melted resin or that is tolerant of a molding temperature. By applying heat to the electronic module 10 having two sides of the flexible substrate 12 sealed with a thermoplastic resin as described above so as to be deformed, the electronic module 10 may be formed by bending it at a predetermined angle in various shapes, such as arch-like shape, L-shape, or U-shape.

In the electronic module 10 according to the embodiment, the device 14 is coupled to the wiring pattern 13 formed on the surface of the flexible substrate 12; therefore, the substrate 12 gets deformed due to the pressure from the sealing resin so as to reduce the force received by the substrate 12 from the resin. Thus, the device 4 connected to the substrate 12 does not get damaged. Furthermore, the occurrence of disconnection in the wiring pattern 13 of the circuit unit 15 on the substrate 12 is preventable.

In the electronic module 10 according to the embodiment, the wiring pattern 13 is composed of a metallic foil that enables soldering, and the metallic foil is composed of a material having a melting temperature or a recrystallization temperature equal to or less than the molding temperature at which the circuit unit 15 is sealed with the electrical insulating resin. Therefore, due to the molding temperature at which the circuit unit 15 is sealed with the electrical insulating resin, the resin body 16 made of the electrical insulating resin and the wiring pattern 13 of the metallic foil are expanded with heat, and at least part of the metallic material forming the metallic foil gets melted or softened; thus, even when the melted resin sharply flows, the metallic foil is tolerant of deformation. Furthermore, as at least part of the metallic material forming the metallic foil of the wiring pattern 13 gets melted or softened, it is possible to reduce stress received by the substrate 12 due to thermal expansion and contraction of the metallic foil during molding to seal the circuit unit 15.

In the electronic module 10 according to the embodiment, particularly the metallic foil is preferably composed of a solder foil. This facilitates and ensures the connection with solder between the electronic device 14 and the solder foil of the wiring pattern 13.

Furthermore, in the electronic module 10 according to the embodiment, the foundation layer 17 having a conductive property is provided on the surface of the substrate 12, and the metallic foil is formed on the foundation layer 17. Particularly, as the foundation layer 17 is composed of a resin having a conductive property, application of electric currents between the electronic device 14 mounted on the substrate 12 and the wiring pattern 13 is maintainable through the foundation layer 17 having a conductive property even when cracks occur in the wiring pattern 13.

In the electronic module 10 according to the embodiment, as the substrate 12 is composed of a material having air permeability, the melted resin also easily moves to the surface of the substrate 12 at the opposite side of the connecting-side surface, and as the melted resin enters clearances formed in the substrate 12, the pressure to the electronic device 14 coupled to the substrate 12 from the melted resin may be reduced. This may reduce production of defective pieces and improve productivity.

Particularly, in the electronic module 10, the substrate 12 includes the glass cloth made of a large number of glass fibers, and the resin retention layer 18 having flexibility nearly equal to or more than the glass cloth is provided on the glass-cloth surface at the opposite side of the surface at the electronic-device connection side; therefore, it is ensured that the retention layer 18 prevents looseness of the glass cloth in the substrate 12. Furthermore, as the retention layer 18 having flexibility is integrated by being dug into the meshes of the glass cloth, the flexibility of the glass cloth is not disturbed. It is preferable that the retention layer 18 is composed of urethane resin. It is preferable that the retention layer 18 is composed of urethane resin having high flexibility as the flexibility of the glass cloth is further prevented from being disturbed.

Furthermore, according to the embodiment, both surfaces of the circuit unit 5 are covered with a resin by performing two steps during which one surface of the circuit unit 15 is individually covered with a resin; however, both surfaces of the circuit unit 15 may be covered with a resin at a single step.

Next, an explanation is given of another method for manufacturing the electronic module 10 according to the present invention. Here, the same components as those in the above-described embodiment are attached with the same reference numeral, and their explanation is omitted.

Figure 12:
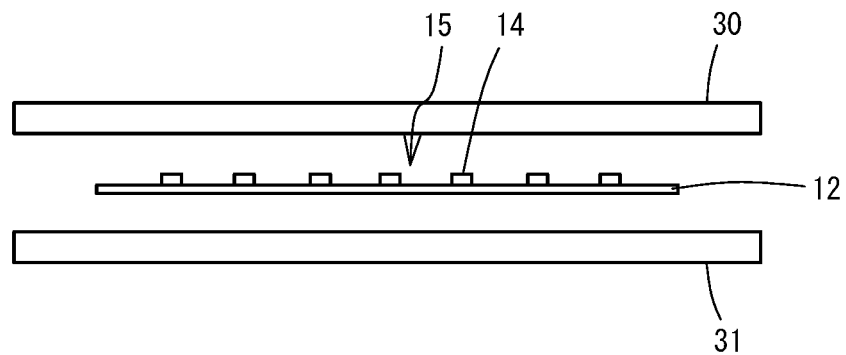
FIG. 12 is a schematic view that illustrates a method for manufacturing an electronic module according to a second embodiment of the present invention.
Figure 12:
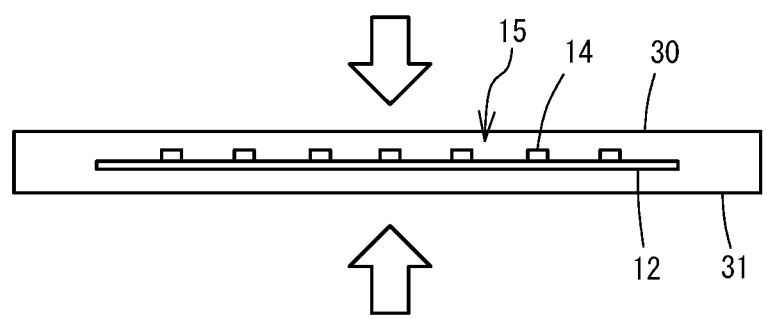
Figure 12:
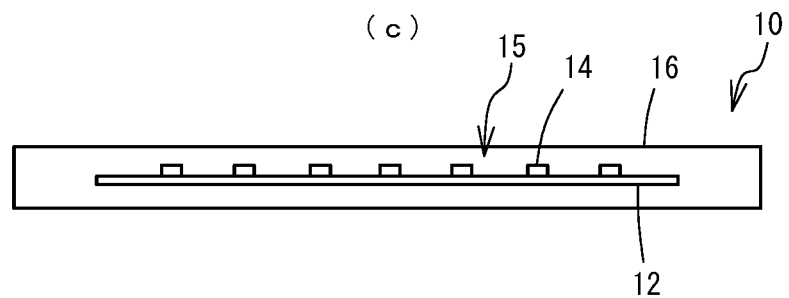

FIG. 12 illustrates the method for manufacturing the electronic module 10 according to a second embodiment of the present invention. According to the embodiment, as illustrated in FIG. 12(*a*), the substrate 12 having the electronic device 14 mounted on the circuit unit 15 is held in a vacuum with a pair of resin sheets 30, 31 that are made of a flexible electrical insulating resin that is a thermoplastic resin. As the electrical insulating resin of the resin sheets 30, 31, the thermoplastic resin described in the above-described embodiment may be used.

Then, as illustrated in FIG. 12(*b*), both surfaces are pressed by an undepicted mold, or the like, and they are heated at the molding temperature of the resin sheets 30, 31 of the thermoplastic resin, whereby the resin sheets 30, 31 are firmly attached to each other. Thus, as illustrated in FIG. 12(*c*), the electronic module 10 is formed in which the electronic device 14 is sealed with the resin body 16 that is molded by the resin sheets 30, 31. This process is performed by, for example, an autoclave device.

Furthermore, the method of sandwiching and sealing the substrate 12 and the circuit unit 15 with the resin sheets 30, 31 may be, other than that described above, placing the substrate 12 and the circuit unit 15, held with the resin sheets 30, 31, in a vacuum bag, removing the air within the vacuum bag, heating them in an oven in the same condition, and after the resin sheets 30, 31 are firmly attached to each other, hardening them to form the electronic module 10.

According to this manufacturing method, it is possible to more easily manufacture the electronic module 10 in which the electronic device 14 is sealed with the resin body 16 of the electrical insulating resin.

Furthermore, the electronic module 10 may be formed by placing the substrate 12 and the circuit unit 15, held with the resin sheets 30, 31, inside a vacuum laminator device, removing the air within the vacuum laminator device, pressing and heating them in the same condition, firmly attaching the resin sheets 30, 31 to each other, and hardening them.

Figure 13:
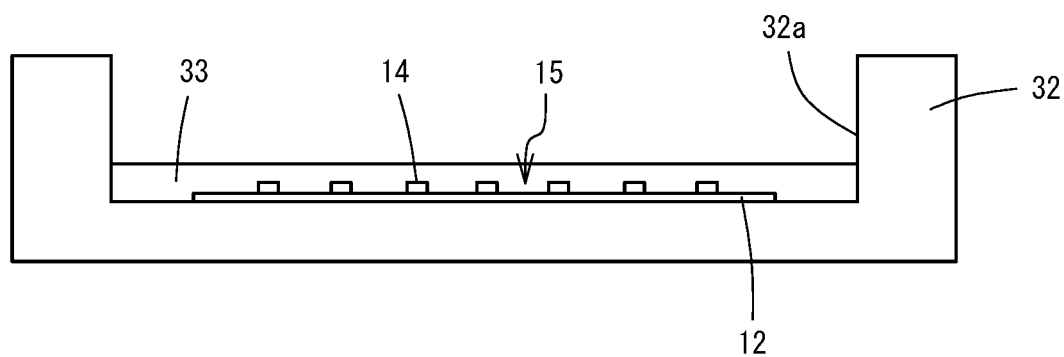
FIG. 13 is a schematic view that illustrates a method for manufacturing an electronic module according to a third embodiment of the present invention.
Figure 13:
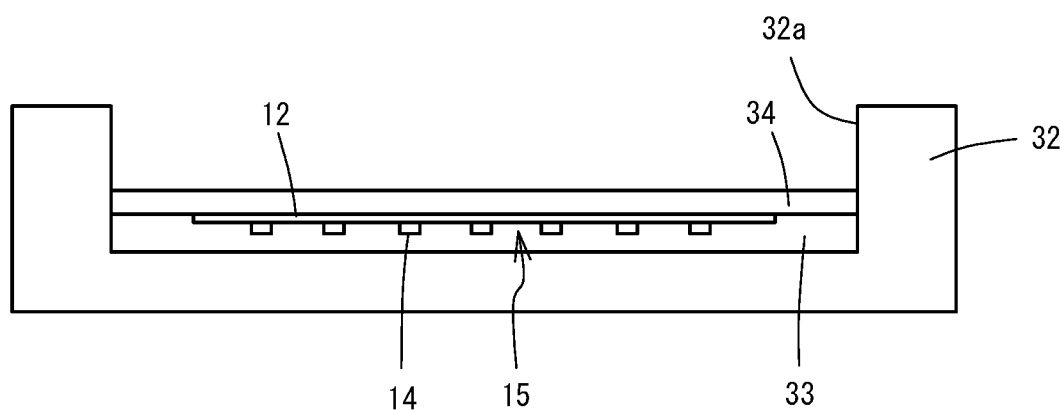
Figure 13:
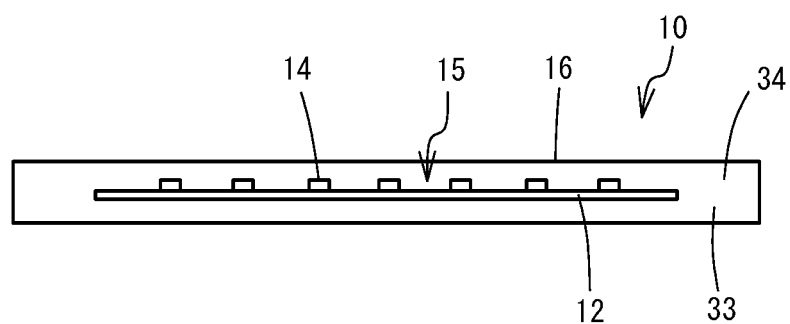

FIG. 13 illustrates a method for manufacturing the electronic module 10 according to a third embodiment of the present invention. According to the embodiment, as illustrated in FIG. 13(a), silicone resin is used as the electrical insulating resin that is a thermo-setting resin and has flexibility.

First, the substrate 12 having the circuit unit 15 formed thereon is placed in a housing portion 32a of a mold 32, a liquid silicone resin 33, which is a thermo-setting resin having flowability, is mixed with a hardening agent, and it is injected into the housing portion 32a. While the substrate 12 and the circuit unit 15 are immersed in the mixed liquid of the thermo-setting resin and the hardening agent, the silicone resin 33 is caused to be hardened, and one of the surfaces of the substrate 12 and the circuit unit 15 is sealed with an electrical insulating resin.

Then, as illustrated in FIG. 13(b), the substrate 12 is placed in the housing portion 32a of the mold 32 while the other one of the surfaces of the substrate 12 and the circuit unit 15, here, the surface where the electronic device 14 is not mounted, faces upward, a silicone resin 34 is injected into the housing portion 32a, and the silicone resin 34 is caused to be hardened with the hardening agent. Thus, as illustrated in FIG. 13(c), the electronic module 10 is formed, in which the electronic device 14 is sealed with the resin body 16 of the silicone resins 33, 34.

According to this manufacturing method, too, it is possible to more easily manufacture the electronic module 10 in which the electronic device 14 is sealed with the resin body 16 of the electrical insulating resin having a heat hardening property.

In the method for manufacturing the electronic module 10 according to the third embodiment, the electronic module 10 may be molded through the use of a liquid silicone resin by placing the substrate 12 having the circuit unit 15 formed therein in the cavity of an undepicted mold and injecting the liquid silicone resin into the cavity. Here, the injected liquid silicone resin and its hardening agent are separately injected into the cavity of the mold while being pressed, and the liquid silicone resin is caused to be hardened. According to this manufacturing method, too, the substrate 12 and the circuit unit 15 may be sealed with silicone resin that is a thermo-setting resin having flexibility.

Figure 14:
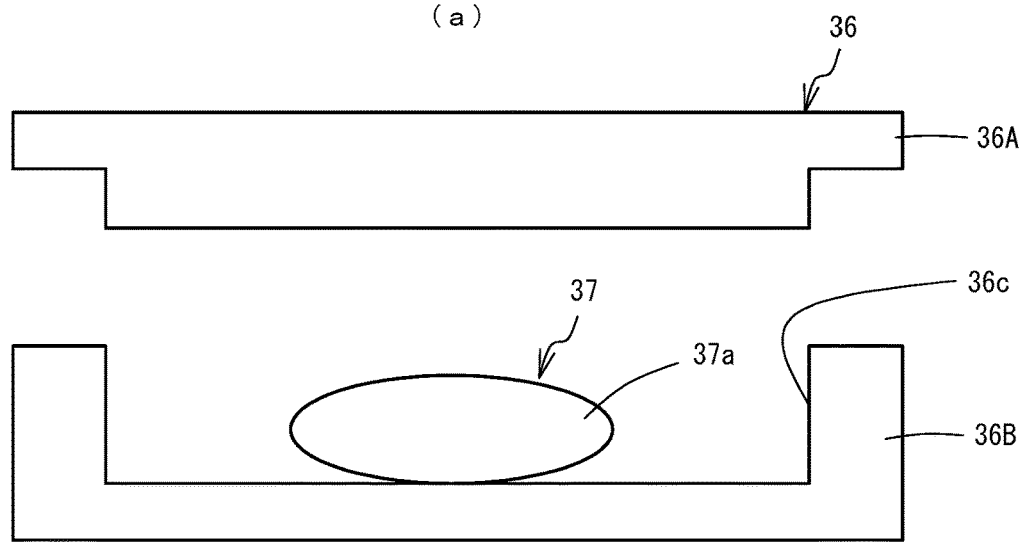
FIG. 14 is a schematic view that illustrates a method for manufacturing an electronic module according to a fourth embodiment of the present invention.
Figure 14:
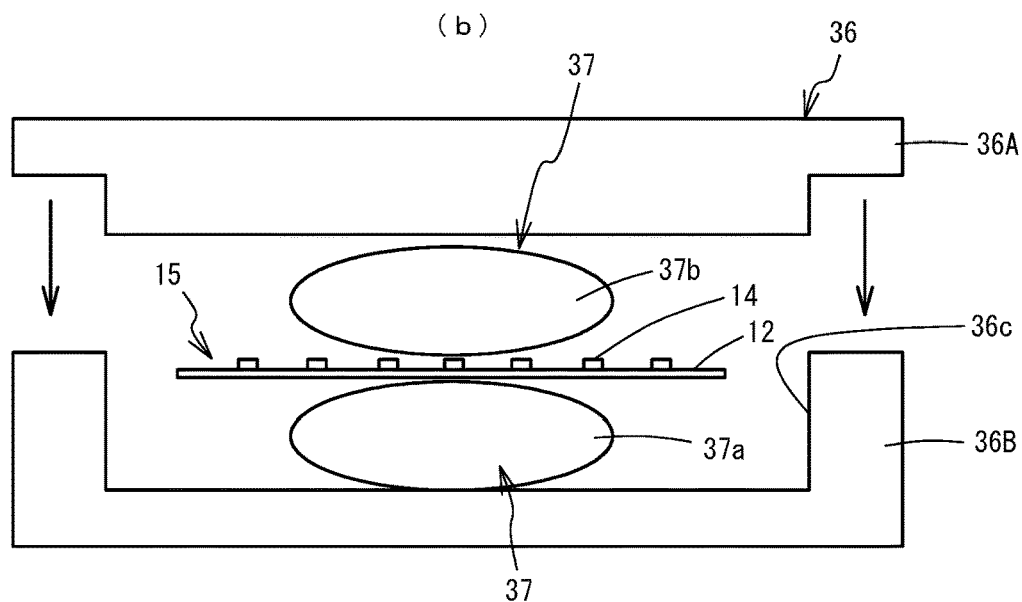
Figure 14:
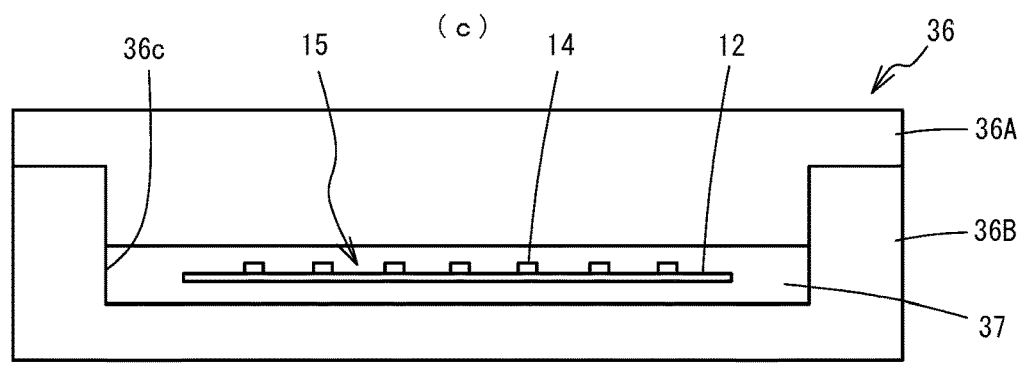

FIG. 14 illustrates a method for manufacturing the electronic module 10 according to a fourth embodiment of the present invention. According to the embodiment, a silicone resin that is an electrical insulating resin is molded by using a pressing mold 36 that is a mold illustrated in FIG. 14(a). A silicone resin 37 used here is a raw-rubber silicone resin that is a thermo-setting resin, has flexibility, has a plastic property, and enables pressing molding, and it is also called silicone rubber.

First, an upper mold 36A and a lower mold 36B of the pressing mold 36 are opened, and a mass 37a of the silicone resin 37 in a plastically deformable state is placed in a housing portion 36c of the lower mold 36B. The amount of the mass 37a is an amount enough to cover an area of the substrate 12 where the electronic device 14 is not mounted. Then, the substrate 12 having the circuit unit 15 formed thereon is placed on the mass 37a of the silicone resin 37, and as illustrated in FIG. 14(b), a mass 37b of the silicone resin 37 is further placed on the substrate 12 and the circuit unit 15, the upper mold 36A and the lower mold 36B of the pressing mold 36 are closed, and pressure molding is conducted. Here, heat is also applied so that the silicone resin 37 is caused to be hardened and molded. Thus, as illustrated in FIG. 14(c), the electronic module 10 is formed, in which the electronic device 14 is sealed with the resin body 16 of the silicone resin 37.

According to this manufacturing method, too, it is possible to more easily manufacture the electronic module 10 in which the electronic device 14 is sealed with the resin body 16 of the electrical insulating resin having a heat hardening property.

Furthermore, the electronic module and the method for manufacturing the same according to the present invention are not limited to the above-described embodiments, and the electronic device includes a chip-like electronic component, such as resistor, coil, capacitor, diode, transistor, or various power elements, integrated circuit elements for IC, or the like. When only an electronic device other than the optical devices is mounted on a substrate, the resin body does not always need to be composed of a transparent resin material. Furthermore, in the embodiment illustrated, the retention layer of urethane resin having flexibility is provided on the surface of the glass cloth at the opposite side of the surface where the electronic device is mounted; however, the retention layer may be omitted. Moreover, the foundation layer may be formed by not only screen printing but also offset printing, gravure printing, inkjet printing, or the like.

DESCRIPTION OF REFERENCE NUMERALS

10 ELECTRONIC MODULE
12 SUBSTRATE
13 WIRING PATTERN
13a WIRING SOLDER
14 ELECTRONIC DEVICE
15 CIRCUIT UNIT
15a TERMINAL PORTION
16 RESIN BODY
17 FOUNDATION LAYER
17a FOUNDATION INK
18 RETENTION LAYER
19 MOLD
19A FIXED-SIDE MOLD PORTION
19B MOVABLE-SIDE MOLD PORTION
19S, 19S1 CAVITY
20 SCREEN
20A OPENING
21 SQUEEGEE
22 SOLDER
23 MARK
24 FIRST RECESSED PORTION
24A MAIN-BODY SIDE RECESSED PORTION

24B TERMINAL-PORTION SIDE RECESSED PORTION
25 SECOND RECESSED PORTION
25A RESIN-FILLING RECESSED PORTION
25B TERMINAL-PORTION SIDE RECESSED PORTION
26 THIRD RECESSED PORTION
D1 PRIMARILY MOLDED OBJECT
D1a MAIN BODY PORTION
H1, H2 INJECTION PORT

The invention claimed is:

1. An electronic module comprising:
a substrate having flexibility and an electrical insulation property;
a circuit unit in which an electronic device is mounted on a wiring pattern formed on at least one of surfaces of the substrate; and
a resin body in which the circuit unit is sealed with an electrical insulating resin,
wherein:
the substrate has flexibility to be deformable due to pressure during sealing with the electrical insulating resin,
the wiring pattern is composed of a metallic foil that enables soldering, and
the metallic foil is composed of a material having a recrystallization temperature that is equal to or less than a molding temperature at which the circuit unit is sealed with the electrical insulating resin.

2. The electronic module according to claim 1, wherein the metallic foil is composed of a solder foil.

3. The electronic module according to claim 1, further comprising a foundation layer having a conductive property on the one of the surfaces of the substrate,
wherein the metallic foil is formed on the foundation layer.

4. The electronic module according to claim 3, wherein the foundation layer has solderability for melted solder.

5. The electronic module according to claim 1, wherein the substrate is composed of a material having air permeability.

6. The electronic module according to claim 5, wherein the substrate is composed of a glass cloth made of glass fibers, and
wherein a retention layer made of a resin having flexibility nearly equal to or more than the flexibility of the glass cloth is provided on a surface of the glass cloth at an opposite side of the glass cloth from a surface where the electronic device is mounted.

7. The electronic module according to claim 6, wherein the retention layer is composed of urethane resin.

8. An electronic module comprising:
a substrate having flexibility and an electrical insulation property;
a circuit unit in which an electronic device is mounted on a wiring pattern formed on at least one of surfaces of the substrate; and
a resin body in which the circuit unit is sealed with an electrical insulating resin,
wherein:
the substrate has flexibility to be deformable due to pressure during sealing with the electrical insulating resin,
the wiring pattern is composed of a metallic foil that enables soldering, and
the metallic foil is composed of a material having a melting temperature that is equal to or less than a molding temperature at which the circuit unit is sealed with the electrical insulating resin.

9. The electronic module according to claim 8, wherein the metallic foil is composed of a solder foil.

10. The electronic module according to claim 8, further comprising a foundation layer having a conductive property on the one of the surfaces of the substrate,
wherein the metallic foil is formed on the foundation layer.

11. The electronic module according to claim 10, wherein the foundation layer has solderability for melted solder.

12. The electronic module according to claim 8, wherein the substrate is composed of a material having air permeability.

13. The electronic module according to claim 12, wherein the substrate is composed of a glass cloth made of glass fibers, and
wherein a retention layer made of a resin having flexibility nearly equal to or more than the flexibility of the glass cloth is provided on a surface of the glass cloth at an opposite side of the glass cloth from a surface where the electronic device is mounted.

14. The electronic module according to claim 13, wherein the retention layer is composed of urethane resin.

15. A method for manufacturing an electronic module, the method comprising:
a circuit-unit forming step that comprises forming a circuit unit by forming a wiring pattern on a surface of a substrate having flexibility and an electrical insulation property and mounting an electronic device on the wiring pattern; and
a sealing step that comprises sealing the circuit unit with a resin body of an electrical insulating resin,
wherein:
the substrate is composed of a flexible material that is deformable during sealing with the electrical insulating resin,
the sealing step includes sealing the substrate and the circuit unit with the electrical insulating resin,
the wiring pattern is composed of a metallic foil that enables soldering,
the metallic foil has a recrystallization temperature that is equal to or less than a molding temperature of the electrical insulating resin, and
the circuit-unit forming step includes soldering the electronic device to the wiring pattern.

16. The method for manufacturing the electronic module according to claim 15, wherein the sealing step includes:
mounting the substrate and the circuit unit in a cavity of a mold,
injecting the electrical insulating resin, which is melted and has thermal plasticity, into the cavity to be molded and hardened, and
sealing the substrate and the circuit unit with the electrical insulating resin.

17. The method for manufacturing the electronic module according to claim 15, wherein the sealing step includes:
sandwiching the substrate and the circuit unit between sheets of the electrical insulating resin that have thermal plasticity,
causing the sheets to be pressed against each other, and sealing the substrate and the circuit unit.

18. The method for manufacturing the electronic module according to claim 15, wherein the sealing step includes:
mounting the substrate and the circuit unit in a cavity of a mold, injecting, as the electrical insulating resin, a thermo-setting resin having flowability into the cavity to be hardened, and sealing the substrate and the circuit unit with the thermo-setting resin.

19. The method for manufacturing the electronic module according to claim 15, wherein the sealing step includes:
mounting the substrate and the circuit unit in a mold,
injecting, as the electrical insulating resin, a thermo-setting resin having flowability into the mold,
immersing the substrate and the circuit unit in the thermo-setting resin,
hardening the thermo-setting resin, and
sealing the substrate and the circuit unit with the thermo-setting resin.

20. The method for manufacturing the electronic module according to claim 15, wherein the sealing step includes:
mounting the substrate and the circuit unit in a mold,
sandwiching the substrate and the circuit unit with soft thermo-setting resin as the electrical insulating resin,
forming the soft thermo-setting resin with the mold, and
sealing the substrate and the circuit unit.

21. A method for manufacturing an electronic module, the method comprising:
a circuit-unit forming step that comprises forming a circuit unit by forming a wiring pattern on a surface of a substrate having flexibility and an electrical insulation property and mounting an electronic device on the wiring pattern; and
a sealing step that comprises sealing the circuit unit with a resin body of an electrical insulating resin,
wherein:
the substrate is composed of a flexible material that is deformable during sealing with the electrical insulating resin,
the sealing step includes sealing the substrate and the circuit unit with the electrical insulating resin,
the wiring pattern is composed of a metallic foil that enables soldering,
the metallic foil has a melting temperature that is equal to or less than a molding temperature of the electrical insulating resin, and
the circuit-unit forming step includes soldering the electronic device to the wiring pattern.

22. The method for manufacturing the electronic module according to claim 21, wherein the sealing step includes:
mounting the substrate and the circuit unit in a cavity of a mold,
injecting the electrical insulating resin, which is melted and has thermal plasticity, into the cavity to be molded and hardened, and
sealing the substrate and the circuit unit with the electrical insulating resin.

23. The method for manufacturing the electronic module according to claim 21, wherein the sealing step includes:
sandwiching the substrate and the circuit unit between sheets of the electrical insulating resin that have thermal plasticity,
causing the sheets to be pressed against each other, and
sealing the substrate and the circuit unit.

24. The method for manufacturing the electronic module according to claim 21, wherein the sealing step includes:
mounting the substrate and the circuit unit in a cavity of a mold,
injecting, as the electrical insulating resin, a thermo-setting resin having flowability into the cavity to be hardened, and
sealing the substrate and the circuit unit with the thermo-setting resin.

25. The method for manufacturing the electronic module according to claim 21, wherein the sealing step includes:
mounting the substrate and the circuit unit in a mold,
injecting, as the electrical insulating resin, a thermo-setting resin having flowability into the mold,
immersing the substrate and the circuit unit in the thermo-setting resin,
hardening the thermo-setting resin, and
sealing the substrate and the circuit unit with the thermo-setting resin.

26. The method for manufacturing the electronic module according to claim 21, wherein the sealing step includes:
mounting the substrate and the circuit unit in a mold,
sandwiching the substrate and the circuit unit with soft thermo-setting resin as the electrical insulating resin,
forming the soft thermo-setting resin with the mold, and
sealing the substrate and the circuit unit.

* * * * *